United States Patent
El-Nozahi et al.

(10) Patent No.: US 12,124,284 B2
(45) Date of Patent: Oct. 22, 2024

(54) APPARATUS AND METHODS FOR COMPENSATING SUPPLY SENSITIVE CIRCUITS FOR SUPPLY VOLTAGE VARIATION

(71) Applicant: Analog Devices International Unlimited Company, Limerick (IE)

(72) Inventors: Mohamed El-Nozahi, Cairo (EG); Amr G. Elgamal, Cairo (EG)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 18/365,087

(22) Filed: Aug. 3, 2023

(65) Prior Publication Data

US 2023/0376064 A1    Nov. 23, 2023

Related U.S. Application Data

(62) Division of application No. 16/949,234, filed on Oct. 21, 2020, now Pat. No. 11,755,047.

(51) Int. Cl.
*G05F 1/577*    (2006.01)
*G05F 3/24*    (2006.01)
(Continued)

(52) U.S. Cl.
CPC .............. *G05F 1/577* (2013.01); *G05F 3/242* (2013.01); *H03F 1/0211* (2013.01); *H01Q 3/36* (2013.01)

(58) Field of Classification Search
CPC ........ G05F 1/577; G05F 3/242; H03F 1/0211; H03F 2200/21; H03F 1/223;
(Continued)

(56) References Cited

U.S. PATENT DOCUMENTS

| 5,304,946 A | 4/1994 | Sano et al. |
| 6,614,309 B1 | 9/2003 | Pehlke |

(Continued)

FOREIGN PATENT DOCUMENTS

| CN | 111431411 | 7/2020 | |
| JP | 2014-26680 | 2/2014 | |
| JP | 2014026680 A | * 2/2014 | ............. G11C 17/00 |

OTHER PUBLICATIONS

International Search Report and Written Opinion received in PCT/EP2021/078832, mailed Jan. 31, 2022.

*Primary Examiner* — Jung Kim
(74) *Attorney, Agent, or Firm* — Knobbe, Martens, Olson & Bear, LLP

(57) ABSTRACT

Apparatus and methods for compensating supply sensitive circuits for supply voltage variation are provided. An electronic system includes a power supply that outputs a supply voltage having a nominal voltage level, a supply conductor for routing the supply voltage, and a group of integrated circuits (ICs) that each receive the supply voltage from the supply conductor. Each IC includes a supply sensing circuit that generates a sense signal based on a local voltage level of the supply voltage at the IC, a bias control circuit that adjusts a bias signal based on the sense signal to account for a difference between the nominal voltage level and the local voltage level of the supply voltage, and a signal processing circuit biased by the bias signal.

20 Claims, 11 Drawing Sheets

(51) Int. Cl.
*H03F 1/02* (2006.01)
*H01Q 3/36* (2006.01)

(58) Field of Classification Search
CPC ........... H03F 2200/451; H03F 2200/75; H03F 1/301; H03F 3/195; H03F 3/245; H03F 1/0261; H03F 2200/471; H03F 2200/555; H01Q 3/36

See application file for complete search history.

(56) References Cited

U.S. PATENT DOCUMENTS

| | | |
|---|---|---|
| 7,038,482 B1 | 5/2006 | Bi |
| 7,873,854 B2 | 1/2011 | Westwick et al. |
| 8,432,180 B2 | 4/2013 | Burns et al. |
| 8,461,928 B2 | 6/2013 | Yahav et al. |
| 9,166,533 B2 | 10/2015 | Marra et al. |
| 9,660,600 B2 | 5/2017 | Whittaker |
| 9,705,465 B2 | 7/2017 | Bodnar et al. |
| 9,853,645 B1 | 12/2017 | Mukhanov et al. |
| 9,866,178 B2 | 1/2018 | Anderson |
| 10,003,308 B2 | 6/2018 | Lam |
| 10,033,336 B2 | 7/2018 | Banowetz et al. |
| 10,454,425 B2 | 10/2019 | Jales |
| 10,666,200 B2 | 5/2020 | Gebeyehu et al. |
| 10,673,400 B2 | 6/2020 | Lasser et al. |
| 2011/0025422 A1 | 2/2011 | Marra et al. |
| 2014/0152390 A1 | 6/2014 | McMorrow et al. |
| 2018/0254745 A1 | 9/2018 | Kovac |
| 2019/0081024 A1 | 3/2019 | El-Mansouri et al. |
| 2020/0227469 A1 | 7/2020 | Then et al. |

\* cited by examiner

APPARATUS AND METHODS FOR COMPENSATING SUPPLY SENSITIVE CIRCUITS FOR SUPPLY VOLTAGE VARIATION

CROSS-REFERENCE TO RELATED APPLICATIONS

This application is a divisional of U.S. Non-Provisional application Ser. No. 16/949,234, filed Oct. 21, 2020, the disclosure of which is hereby incorporated by reference in its entirety herein.

FIELD OF THE DISCLOSURE

Embodiments of the invention relate to electronic systems, and more particularly, to supply sensitive circuits.

BACKGROUND

An integrated circuit (IC) includes at least one power supply pin for receiving a supply voltage from a power supply. The supply voltage received by the IC is used to provide power to circuitry formed on the IC.

When attached to a circuit board, the IC receives the supply voltage by way of a circuit board trace. For example, the circuit board can correspond to a printed circuit board (PCB) that has been patterned to form a power supply bus for delivering the supply voltage to the IC.

SUMMARY OF THE DISCLOSURE

Apparatus and methods for compensating supply sensitive circuits for supply voltage variation are provided. In certain embodiments, an electronic system includes a power supply that outputs a supply voltage having a nominal voltage level, a supply conductor for routing the supply voltage, and a group of integrated circuits (ICs) that each receive the supply voltage from the supply conductor. Each IC includes a supply sensing circuit that generates a sense signal based on a local voltage level of the supply voltage at the IC, a bias control circuit that adjusts a bias signal based on the sense signal to account for a difference between the nominal voltage level and the local voltage level of the supply voltage, and a signal processing circuit biased by the bias signal. By implementing the ICs with supply voltage compensation in this manner, the signal processing circuits exhibit supply invariant performance.

In one aspect, an electronic system is provided. The electronic system includes a supply conductor configured to route a supply voltage having a nominal voltage level, and a plurality of semiconductor dies each configured to receive the supply voltage from the supply conductor. Each of the plurality of semiconductor dies includes a supply sensing circuit configured to generate a sense signal based on a local voltage level of the supply voltage, a bias control circuit configured to adjust a bias signal based on the sense signal to account for a difference between the nominal voltage level and the local voltage level of the supply voltage, and a signal processing circuit biased by the bias signal.

In another aspect, a method of compensating for supply voltage variation in an electronic system is provided. The method includes providing a supply voltage to a plurality of semiconductor dies using a supply conductor, the supply voltage having a nominal voltage level. The method further includes sensing a local voltage level of the supply voltage for each of the plurality of semiconductor dies, adjusting a bias signal on each of the plurality of semiconductor dies to account for a difference between the nominal voltage level and the local voltage level of the supply voltage, and biasing a signal processing circuit on each of the plurality of semiconductor dies using the bias signal.

In another aspect, a semiconductor die for a multi-chip signal processing system is provided. The semiconductor die includes a supply pin configured to receive a supply voltage, a supply sensing circuit configured to generate a sense signal based on a local voltage level of the supply voltage at the supply pin, a bias control circuit configured to adjust a bias signal based on the sense signal to account for a difference between a nominal voltage level of the supply voltage and the local voltage level of the supply voltage, and a signal processing circuit biased by the bias signal.

DETAILED DESCRIPTION OF EMBODIMENTS

Figure 1A:
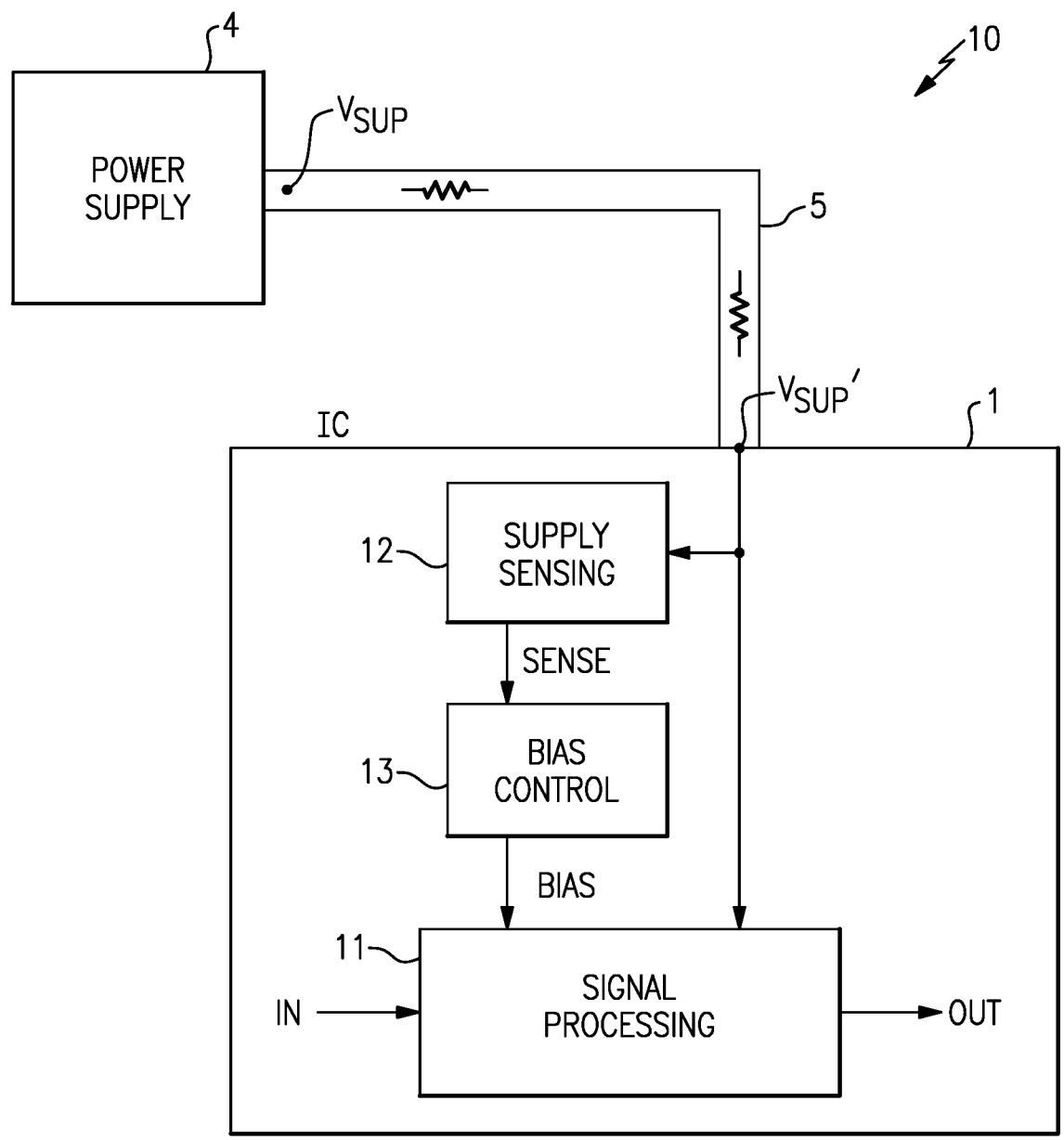
FIG. 1A is a schematic diagram of one embodiment of an electronic system with compensation for supply voltage variation.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Apparatus and methods for compensating supply sensitive circuits for supply voltage variation are provided. In certain embodiments, an electronic system includes a power supply that outputs a supply voltage having a nominal voltage level, a supply conductor for routing the supply voltage, and a group of integrated circuits (ICs) that each receive the supply voltage from the supply conductor. Each IC includes a supply sensing circuit that generates a sense signal based on a local voltage level of the supply voltage at the IC, a bias control circuit that adjusts a bias signal based on the sense signal to account for a difference between the nominal voltage level and the local voltage level of the supply voltage, and a signal processing circuit biased by the bias signal.

By implementing the ICs with supply voltage compensation in this manner, the signal processing circuits exhibit supply invariant performance. Absent such compensation, the performance of the signal processing circuits are impacted by changes in the voltage level of the supply voltage relative to the nominal voltage level. For example, the signal processing circuits can perform a variety of analog and/or RF signaling functions including, but not limited to, amplification, phase shifting, and/or frequency dependent processing, and the performance of such functionality can be impacted by the particular voltage level of the supply voltage.

Thus, the signal processing circuit have a dynamically adjusted bias to account for supply voltage variation. For example, each signal processing circuit can include an amplifier having a DC operating point set by the bias signal, and the bias control circuit of each IC adjusts the local bias signal to maintain a gain of the amplifier substantially constant.

In certain implementations, each signal processing circuit corresponds to a signal processing channel for the electronic system, and an output of each signal processing circuit is combined to generate a combined signal. For example, the electronic system can correspond to a phased array antenna system, and the signal processing circuits can be used for gain control and/or phase control in forming a signal beam.

In such applications, the overall performance of the electronic system is enhanced by reducing or eliminating the impact of supply voltage drop on channel-to-channel variation. For example, in a beamforming application, the outputs of the signal processing circuits can be used to generate a signal beam with precise scanning angle.

FIG. 1A is a schematic diagram of one embodiment of an electronic system 10 with compensation for supply voltage variation. The electronic system 10 includes an IC 1, a power supply 4, and a supply conductor 5. An integrated circuit, such as the IC 1 of FIG. 1A, is also referred to herein as a semiconductor die or semiconductor chip.

As shown in FIG. 1A, the power supply 4 generates a supply voltage $V_{SUP}$, which is provided to one or more supply pins of the IC 1 by way of the supply conductor 5. In certain implementations, the electronic system 10 is implemented on a circuit board, and the supply conductor 5 corresponds to conductive trace of the circuit board. In some implementations, the power supply 4 can correspond to another IC, such as a power management IC that includes at least one switched-mode power supply and/or at least one DC-to-DC converter.

Due to non-zero impedance of the supply conductor 5, losses cause a local voltage level of a supply voltage $V_{SUP}'$ received at the IC 1 being lower than a nominal voltage level of the supply voltage $V_{SUP}$ directly at the output of the power supply 4. For example, the supply conductor 5 can have a resistance that leads to current-resistor (I*R) voltage drops and a corresponding difference between the nominal voltage level and the local voltage level. Moreover, even when the supply conductor 5 is very wide and thick for low resistivity, voltage drop can arise in applications in which the IC 1 draws a relatively large amount of current.

In the illustrated embodiment, the IC 1 includes a signal processing circuit 11, a supply sensing circuit 12, and a bias control circuit 13.

The signal processing circuit 11 receives an input signal IN and generates an output signal OUT. The signal processing circuit 11 also receives a bias signal BIAS for biasing the signal processing circuit 11. For example, the signal processing circuit 11 can include analog and/or RF circuitry that operates with a DC bias point that is set by the bias signal BIAS. Although shown as outputting one output signal and receiving one input signal and one bias signal, the signal processing circuit 11 can be adapted to include any number of inputs and/or outputs.

Absent compensation, the performance of the signal processing circuit 11 is impacted by changes in the voltage level of the supply voltage $V_{SUP}'$. For example, the signal processing circuit 11 can perform a variety of analog and/or RF signaling functions, such as amplification, phase shifting, and/or frequency dependent processing, and the performance of such functionality can be impacted by the particular voltage level of the supply voltage $V_{SUP}'$.

To account for supply voltage variation, the supply sensing circuit 12 senses the voltage level of the supply voltage $V_{SUP}'$, and generates a sense signal SENSE that is provided to the bias control circuit 13. The bias control circuit 13 processes the sense signal SENSE to provide an adjustment to the bias signal BIAS such that the performance of the signal processing circuit 11 is substantially the same in the presence of variation of the supply voltage $V_{SUP}'$. Thus, even if the local voltage level was below the nominal voltage level by 10 mV, 50 mV, or 100 mV, the adjustment to the bias signal BIAS maintains the operation of the signal processing circuit 11 constant across all such supply voltage scenarios.

Accordingly, by implementing the IC 1 with supply voltage compensation, the signal processing circuit 11 exhibits supply invariant performance.

Figure 1B:
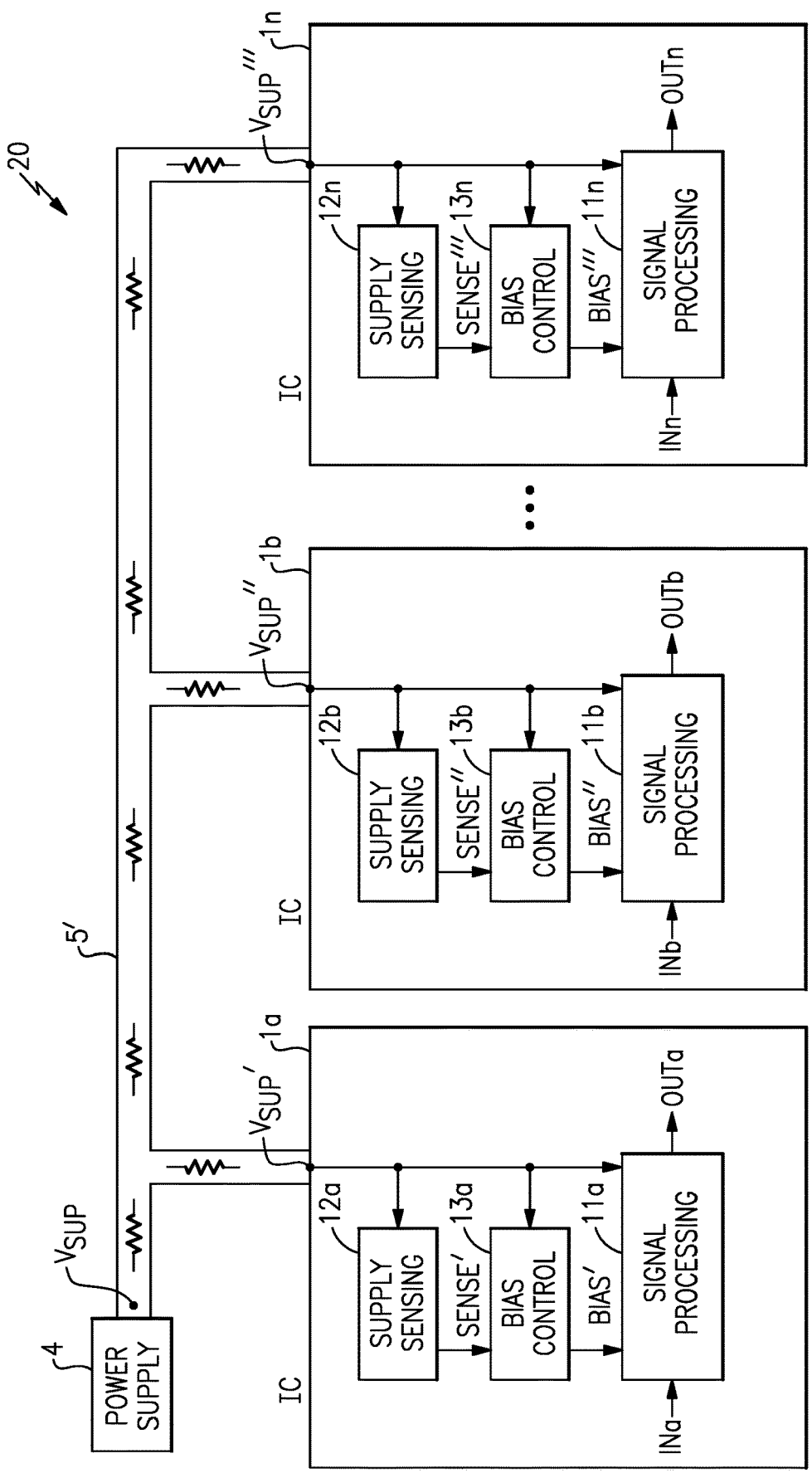
FIG. 1B is a schematic diagram of another embodiment of an electronic system with compensation for supply voltage variation.

FIG. 1B is a schematic diagram of another embodiment of an electronic system 20 with compensation for supply voltage variation. The electronic system 20 includes ICs 1a, 1b, . . . 1n, a power supply 4, and a supply conductor 5'.

In comparison to the electronic system 10 of FIG. 1A, the electronic system 20 of FIG. 1B includes multiple ICs that are powered by the supply voltage $V_{SUP}$ provided by the power supply 4. Although an example with three ICs is shown, more or fewer ICs can be included as indicated by the ellipsis.

As shown in FIG. 1B, the supply voltage $V_{SUP}$ is routed from the output of the power supply 4 to pins of the ICs 1a, 1b, . . . 1n by way of the supply conductor 5'. In certain implementations, the electronic system 20 is implemented on a circuit board, and the supply conductor 5' corresponds to conductive trace of the circuit board.

The length of conductor between the power supply 4 and each IC 1a, 1b, . . . 1n varies, which gives rise to differences in the supply voltage level received by each IC. Moreover, even in implementations in which the length of conductor is matched between the power supply 4 and each IC 1a, 1b, . . . 1n, local supply voltage differences can nevertheless arise due to differences in the amount of current drawn by each IC and/or over different sections of the supply conductors.

In the illustrated example, the IC 1a includes one or more supply pins that receive a supply voltage $V_{SUP}'$. Additionally, the IC 1b includes one or more supply pins that receive a supply voltage $V_{SUP}''$, while the IC 1n includes one or more supply pins that receive a supply voltage $V_{SUP}'''$. Thus, the supply voltage level received by each of the ICs 1a, 1b, . . . 1n (the local voltage level of the supply voltage) can vary from IC to IC.

To account for supply voltage variation, each of the ICs 1a, 1b, . . . 1n is implemented using the configuration of FIG. 1A. For example, the IC 1a includes a supply sensing circuit 12a that generates a sense signal SENSE', a bias control circuit 13a that generates a bias signal BIAS' adjusted by the sense signal SENSE', and a signal processing circuit 11a that is biased by the bias signal BIAS' and processes an input signal INa to generate an output signal OUTa.

Likewise, the IC 1b includes a supply sensing circuit 12b that generates a sense signal SENSE", a bias control circuit 13b that generates a bias signal BIAS" adjusted by the sense signal SENSE", and a signal processing circuit 11b that is biased by the bias signal BIAS" and that processes an input signal INb to generate an output signal OUTb. Furthermore, the IC 1n includes a supply sensing circuit 12n that generates a sense signal SENSE''', a bias control circuit 13n that generates a bias signal BIAS''' adjusted by the sense signal SENSE''', and a signal processing circuit 11n that is biased by the bias signal BIAS''' and that processes an input signal INn to generate an output signal OUTn.

In certain implementations, the signal processing circuits 11a, 11b, . . . 11n correspond to signal processing channels that operate in combination with one another to generate a combined signal. In one example, the signal processing circuits 11a, 11b, . . . 11n correspond to RF signal channels of a beamforming communication system, which is also referred to herein as a phased array antenna system. In applications in which the signal processing channels operate in combination with another, variations in the performance of a given channel can degrade the accuracy of the overall system. For instance, in the beamforming context, the scanning angle for beamforming can be degraded when power supply variation degrades the performance of each channel.

To compensate for power supply variation, each of the ICs 1a, 1b, . . . 1n is operable to sense the local supply voltage level and provide adjustments to bias signal levels accordingly. Thus, even when the voltages levels of $V_{SUP}'$, $V_{SUP}''$, and $V_{SUP}'''$ vary from one another, internal IC bias adjustment results in substantially uniform performance across the ICs 1a, 1b, . . . 1n.

Figure 2A:
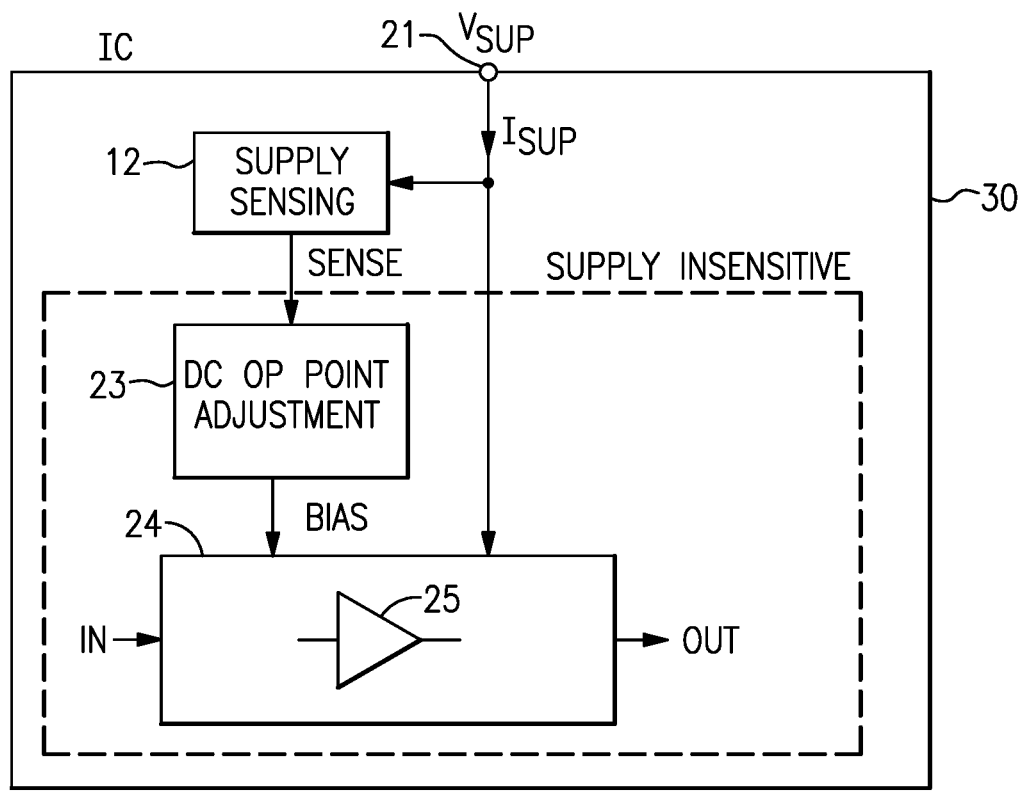
FIG. 2A is a schematic diagram of an integrated circuit (IC) with compensation for supply voltage variation according to another embodiment.

FIG. 2A is a schematic diagram of an IC 30 with compensation for supply voltage variation according to another embodiment. The IC 30 includes at least one pin 21 for receiving a supply voltage $V_{SUP}$. Additionally, the IC 30 further includes a supply sensing circuit 12, a DC operating point adjustment circuit 23, and a signal processing circuit 24 that includes at least one amplifier 25.

As shown in FIG. 2A, the supply sensing circuit 12 receives the local supply voltage $V_{SUP}$ and generates a sense signal SENSE that changes in relation to the supply voltage level. Additionally, the DC operating point adjustment circuit 23 generates a bias signal BIAS based on the sense signal SENSE. In particular, the DC operating point adjustment circuit 23 generates the bias signal BIAS to bias the DC operating point of the amplifier 25 such that a gain of the amplifier 25 is substantially constant across variations in the supply voltage $V_{SUP}$.

Figure 2B:
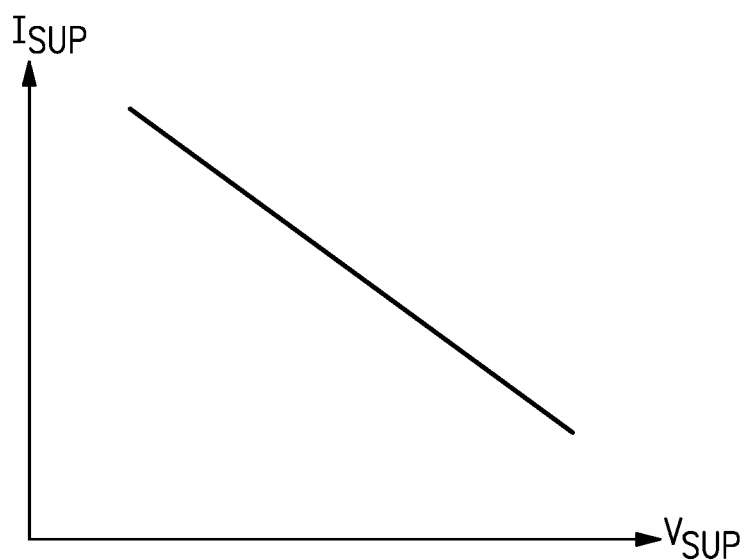
FIG. 2B is a graph of one example of supply current versus supply voltage for one implementation of the IC of FIG. 2A.

FIG. 2B is a graph of one example of supply current $I_{SUP}$ versus supply voltage $V_{SUP}$ for one implementation of the IC 30 of FIG. 2A.

In certain implementations herein, an IC implemented with compensation for supply voltage variation exhibits a decrease in the supply current $I_{SUP}$ as the supply voltage $V_{SUP}$ increases. Thus, rather than having a flat profile of supply current versus supply voltage or a profile of supply current that increases with supply voltage, the IC can exhibit the profile of FIG. 2B.

Although an example in which the profile of the supply current $I_{SUP}$ versus the supply voltage $V_{SUP}$ is substantially linear, other profiles are possible.

Figure 3:
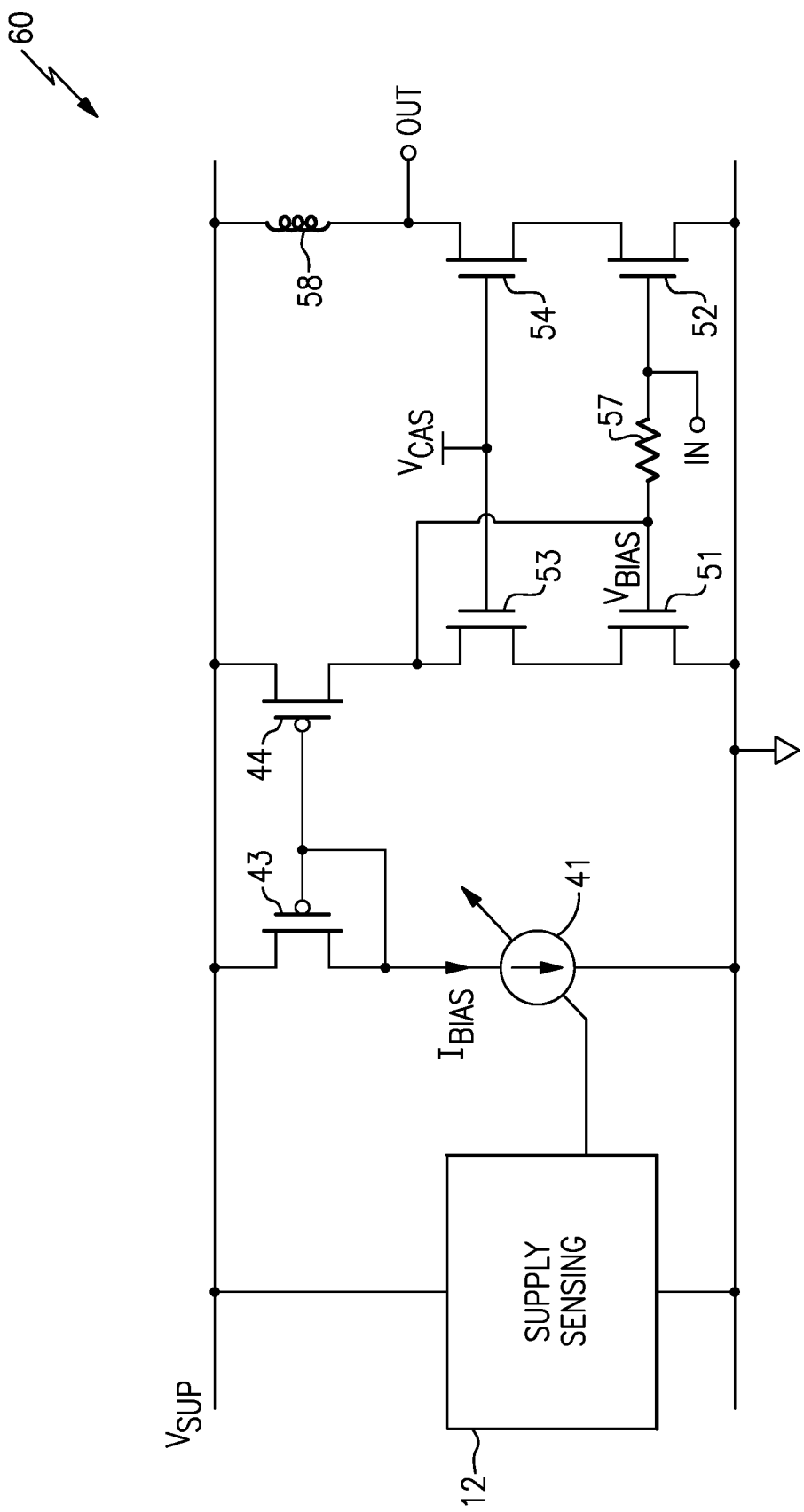
FIG. 3 is a schematic diagram of a supply insensitive amplifier according to one embodiment.

FIG. 3 is a schematic diagram of a supply insensitive amplifier 60 according to one embodiment. The supply insensitive amplifier 60 includes a supply sensing circuit 12, a controllable bias current source 41, a first bias p-type field effect transistor (PFET) 43, a second bias PFET 44, a first bias n-type field effect transistor (NFET) 51, a second bias NFET 53, an amplifier common source NFET 52, an amplifier cascode NFET 54, a bias resistor 57, and a choke inductor 58. The supply insensitive amplifier 60 is powered by a supply voltage $V_{SUP}$, and is used to amplify an input signal received on an input terminal IN to generate an output signal on an output terminal OUT.

Although one embodiment of a circuit compensated for supply voltage variation is depicted, the teachings herein are applicable to a wide variety of signal processing circuits.

In the illustrated embodiment, the controllable bias current source 41 includes a first end electrically connected to a ground voltage and a second end electrically connected to a gate and a drain of the first bias PFET 43 and to a gate of the second bias PFET 44. Additionally, the first bias PFET 43 and the second bias PFET 44 each include a source electrically connected to the supply voltage $V_{SUP}$. The second bias PFET 44 further includes a drain that is electrically connected to a drain of the second bias NFET 53, to a gate of the first bias NFET 51, and to a first end of the bias resistor 57. The first bias NFET 53 further includes a source electrically connected to the ground voltage and a drain electrically connected to a source of the second bias NFET 53. A cascode bias voltage $V_{CAS}$ is used to bias a gate of the second bias NFET 53 and a gate of the amplifier cascode NFET 54. The cascode bias voltage $V_{CAS}$ can be generated using any suitable biasing circuitry.

With continuing reference to FIG. 3, the input terminal IN is connected to a second end of the bias resistor 57 and to a gate of the amplifier common source NFET 52. The amplifier common source NFET 52 includes a source electrically connected to the ground voltage and a drain electrically connected to a source of the amplifier cascode NFET 54. The amplifier cascode NFET 54 further includes a drain electrically connected to the output terminal OUT. The choke inductor 58 includes a first end electrically connected to the supply voltage $V_{SUP}$ and a second end electrically connected to the output terminal OUT.

As shown in FIG. 3, the supply sensing circuit 12 adjusts the amount of bias current $I_{BIAS}$ from the controllable bias current source 41 based on the sensed voltage difference between the supply voltage $V_{SUP}$ and the ground voltage. Additionally, the first bias PFET 43 and the second bias PFET 44 serve as a current mirror that mirrors the adjusted bias current $I_{BIAS}$ to generate a mirrored current that flows through the series combination of the second bias NFET 53 and the first bias NFET 51 to generate a bias voltage $V_{BIAS}$. Additionally, the bias voltage $V_{BIAS}$ is provided to the gate of the amplifier common source NFET 52 through the bias resistor 57.

In the illustrated embodiment, the amplifier is implemented using a cascode amplifier topology in which the amplifier cascode NFET 54 is included between the drain of the amplifier common source NFET 52 and the choke inductor 58. In this example, one cascode device is included, but additional cascode devices can be included or a cascode device can be omitted. Furthermore, although a FET implementation is depicted, implementations using bipolar transistors or a combination using FET and bipolar transistors are also possible.

Although using a cascode amplifier topology mitigates the impact of supply variation on gain, absent compensation a cascode amplifier can nevertheless have gain that changes with supply voltage level.

By adjusting the bias current $I_{BIAS}$ to account for variation of the supply voltage $V_{SUP}$, the amplifier 60 operates with insensitivity to supply voltage variation.

Figure 4A:
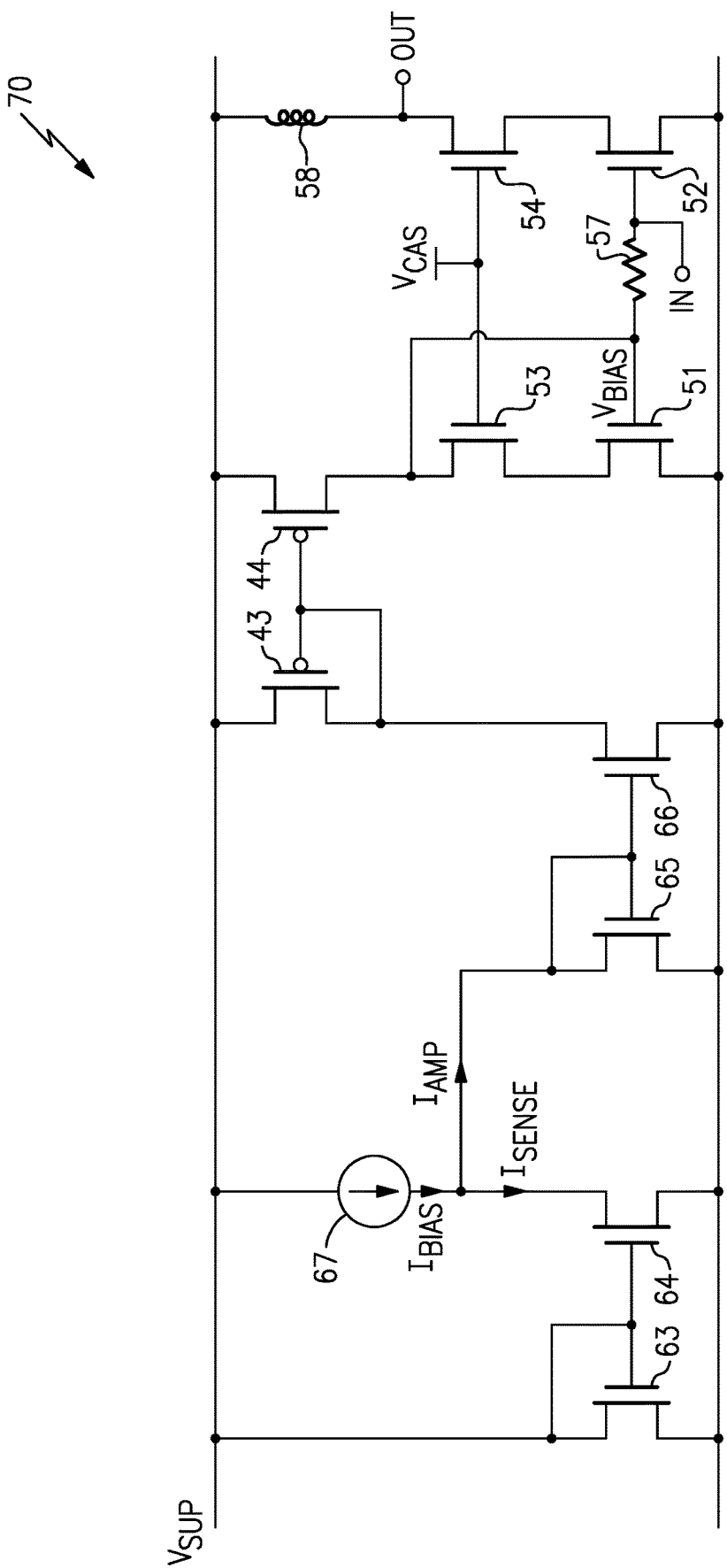
FIG. 4A is a schematic diagram of a supply insensitive amplifier according to another embodiment.

FIG. 4A is a schematic diagram of a supply insensitive amplifier 70 according to another embodiment. The supply insensitive amplifier 70 includes a first bias PFET 43, a second bias PFET 44, a first bias NFET 51, a second bias NFET 53, an amplifier common source NFET 52, an amplifier cascode NFET 54, a bias resistor 57, and a choke inductor 58, which can be as described above with respect to FIG. 3. The supply insensitive amplifier 70 further includes a first sense NFET 63, a second sense NFET 64, a third bias NFET 65, a fourth bias NFET 66, and a bias current source 67.

In the illustrated embodiment, the first sense NFET 63 includes a source electrically connected to the ground voltage, a drain electrically connected to the supply voltage $V_{SUP}$, and a gate electrically connected to the supply voltage $V_{SUP}$ and to a gate of the second sense NFET 64. The bias current source 67 includes a first end electrically connected to the supply voltage $V_{SUP}$ and a second end electrically connected to a drain of the second sense NFET 64, to a gate of the fourth bias NFET 66, and to a gate and a drain of the third bias NFET 65. The second sense NFET 64, the third bias NFET 65, and the fourth bias NFET 66 each include a source connected to the ground voltage.

The first sense NFET 63 and the second sense NFET 64 serve to generate a sense current $I_{SENSE}$ that changes in relation to the supply voltage $V_{SUP}$. The sense current $I_{SENSE}$ is subtracted from the bias current $I_{BIAS}$ of the bias current source 67 to generate an amplifier current $I_{AMP}$. The amplifier current $I_{AMP}$ is mirrored by the third bias NFET 65 and the fourth bias NFET 66 and subsequently processed by the depicted bias circuitry to generate the amplifier bias voltage $V_{BIAS}$.

Figure 4B:
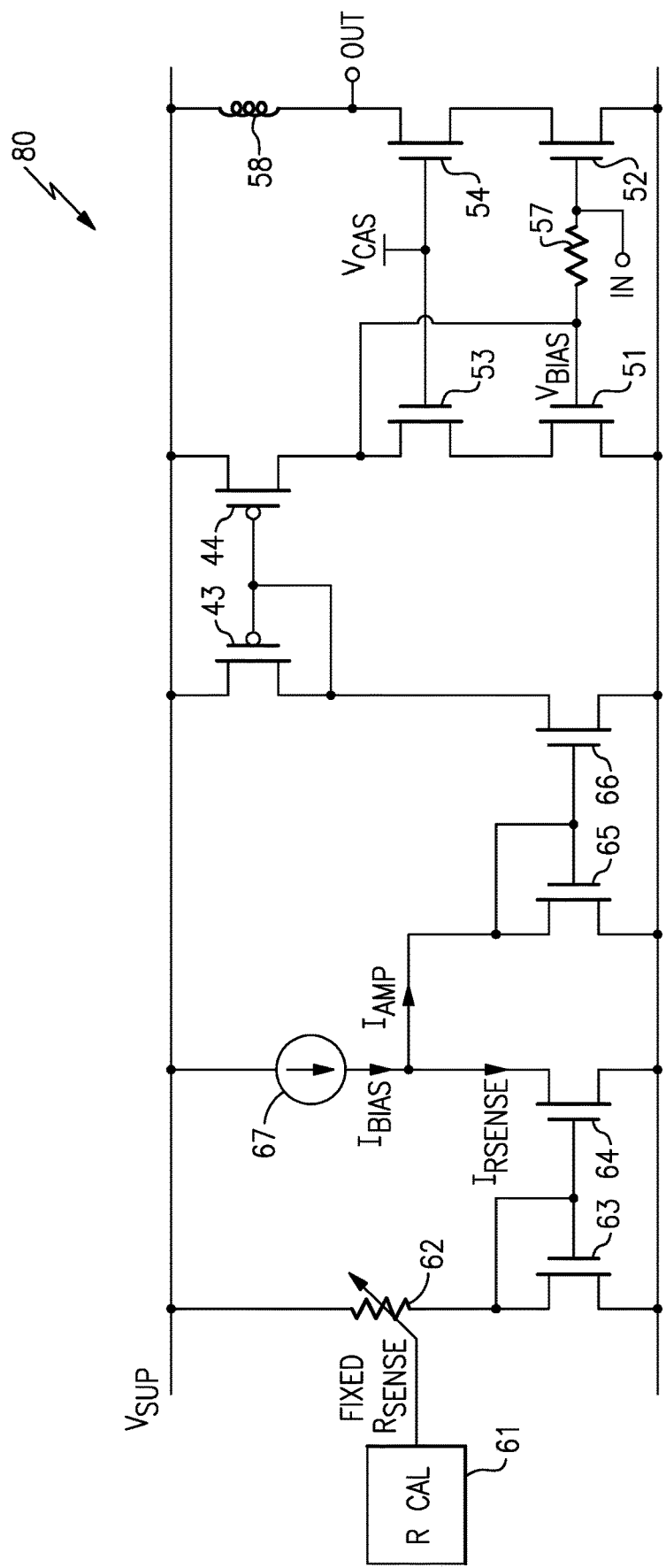
FIG. 4B is a schematic diagram of a supply insensitive amplifier according to another embodiment.

FIG. 4B is a schematic diagram of a supply insensitive amplifier 80 according to another embodiment. The supply insensitive amplifier 80 of FIG. 4B is similar to the supply insensitive amplifier 70 of FIG. 4A, except that the supply insensitive amplifier 80 further includes a resistor calibration circuit 61 and a calibrated sense resistor 62.

As shown in FIG. 4B, the calibrated sense resistor 62 includes a first end electrically connected to the supply voltage $V_{SUP}$ and a second end electrically connected to a gate of the second sense NFET 64 and to a gate and a drain of the first sense NFET 63. The calibrated sense resistor 62 is calibrated by the resistor calibration circuit 61 so as to operate with a fixed resistance $R_{SENSE}$ that is calibrated to account for at least process variation.

By including the calibrated sense resistor 62, enhanced control over a sense current $I_{RSENSE}$ that is subtracted from the bias current $I_{BIAS}$ is realized. Thus, enhanced accuracy in compensation for supply voltage variation is achieved.

Figure 4C:
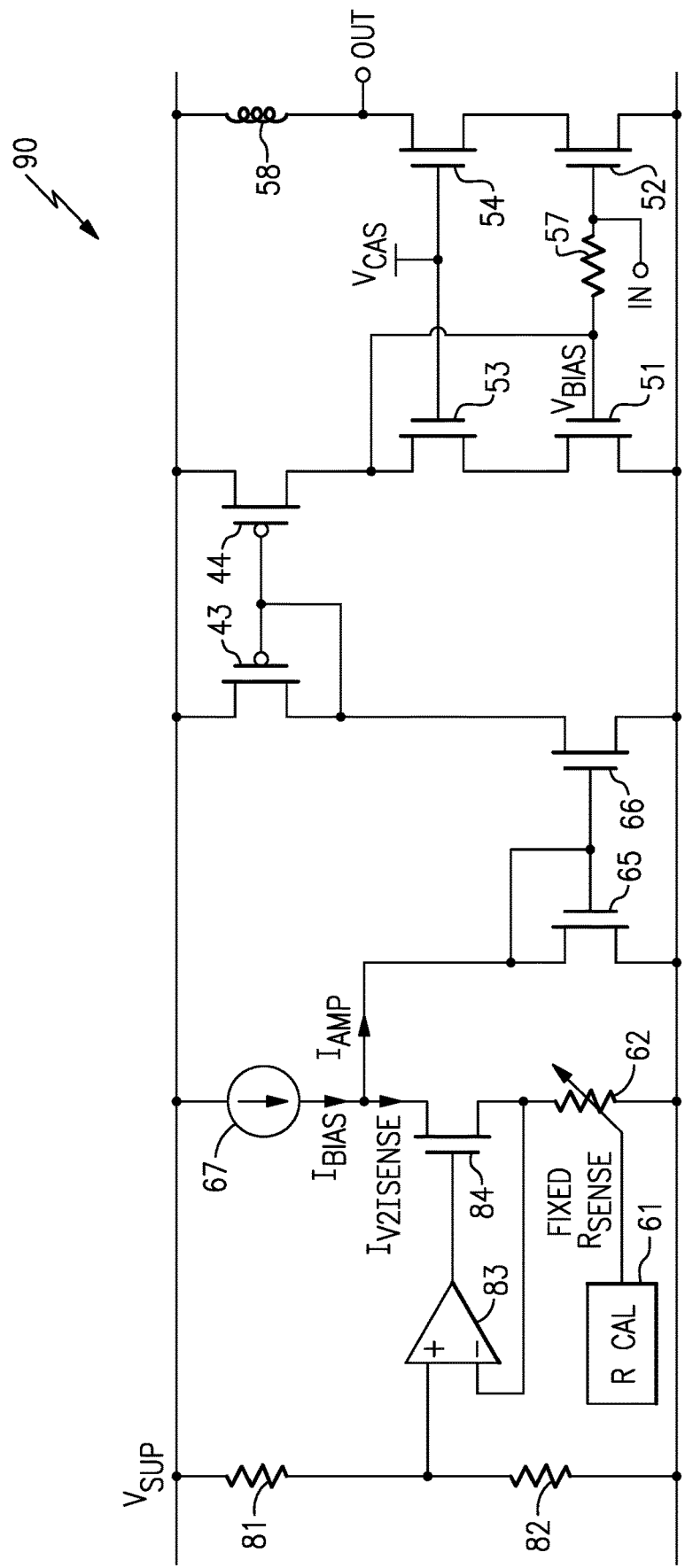
FIG. 4C is a schematic diagram of a supply insensitive amplifier according to another embodiment.

FIG. 4C is a schematic diagram of a supply insensitive amplifier 90 according to another embodiment. In comparison to the supply insensitive amplifier 60 of FIG. 4A, the supply insensitive amplifier 90 of FIG. 4C omits the first sense NFET 63 and the second sense NFET 64 of FIG. 4A in favor of including a first voltage divider resistor 81, a second voltage divider resistor 82, a differential amplifier 83, a regulated NFET 84, a resistor calibration circuit 61 and a calibrated sense resistor 62.

As shown in FIG. 4C, the first voltage divider resistor 81 includes a first end electrically connected to the supply voltage $V_{SUP}$ and a second end electrically connected to a first input of the differential amplifier 83 and to a first end of the second voltage divider resistor 82. Additionally, the differential amplifier 83 includes an output electrically connected to a gate of the regulated NFET 84 and a second input electrically connected to a source of the regulated NFET 84 and to a first end of the calibrated sense resistor 84. The calibrated sense resistor 62 and the second voltage divider resistor 82 each further include a second end electrically connected to the ground voltage. The calibrated sense resistor 62 is calibrated by the resistor calibration circuit 61 to operate with a fixed resistance $R_{SENSE}$.

In the illustrated embodiment, a drain of the regulated NFET 84 draws a sense current $I_{V2ISENSE}$, which is subtracted from the bias current $I_{BIAS}$ to generate the amplifier current $I_{AMP}$. The depicted sense circuitry operates as a voltage to current (V2I) loop that converts a sensed supply voltage level (as detected by the resistive voltage divider) to a corresponding sense current $I_{V2ISENSE}$.

Figure 4D:
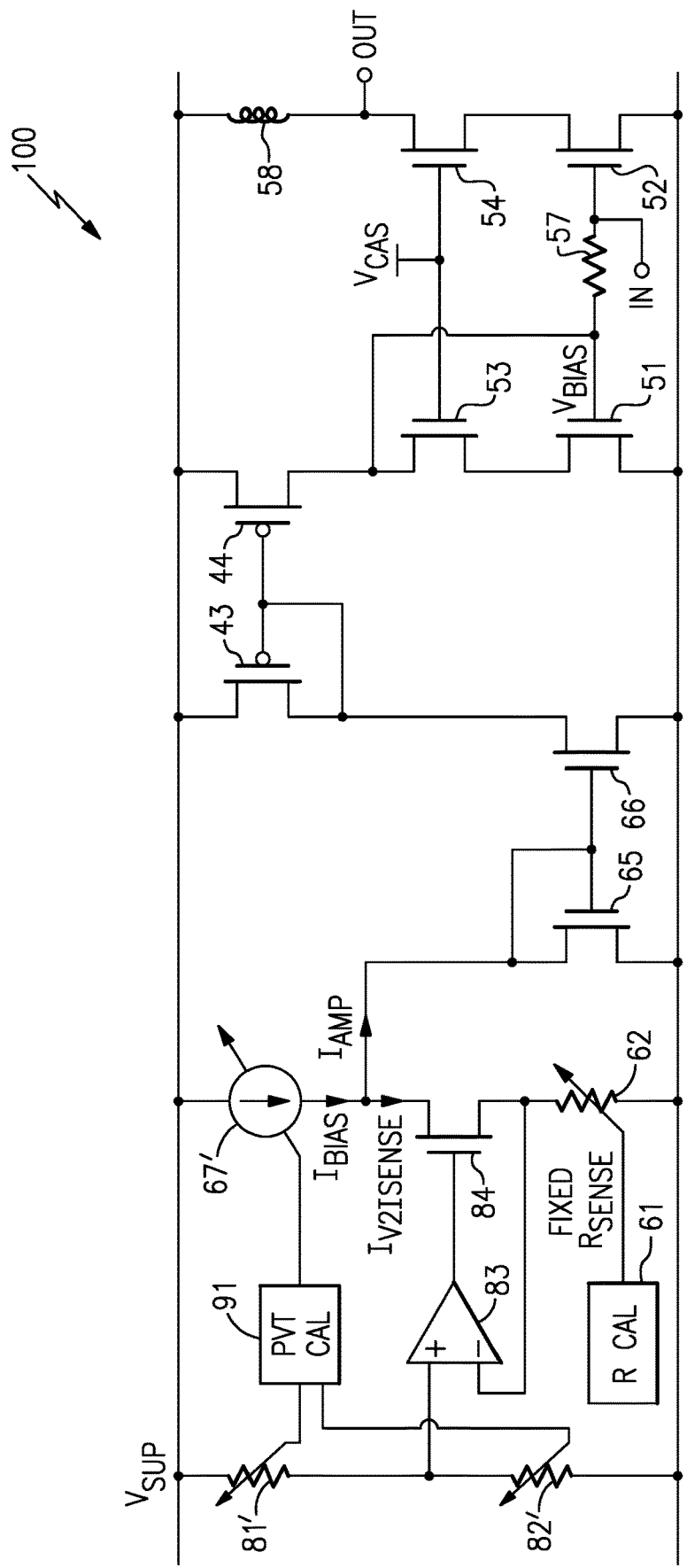
FIG. 4D is a schematic diagram of a supply insensitive amplifier according to another embodiment.

FIG. 4D is a schematic diagram of a supply insensitive amplifier 100 according to another embodiment. In comparison the supply insensitive amplifier 90 of FIG. 4C, the supply insensitive amplifier 100 of FIG. 4D further includes a PVT calibration circuit 91 for providing calibration to account for process, voltage, and/or temperature variation, thereby providing another layer of enhancement of the ability to account for supply voltage variation in the amplifier.

In this example, the PVT calibration circuit 91 adjusts at least one of a resistance of the first voltage divider resistor 81', a resistance of the second voltage divider resistor 82', or a current of the bias current source 67'. However other component(s) can be adjusted to provide such PVT compensation. In certain configurations, the PVT compensation is custom to a specific IC, and can be based on storing data in a non-volatile memory, such as flash memory, magnetic memory, or a fuse.

Figure 5A:
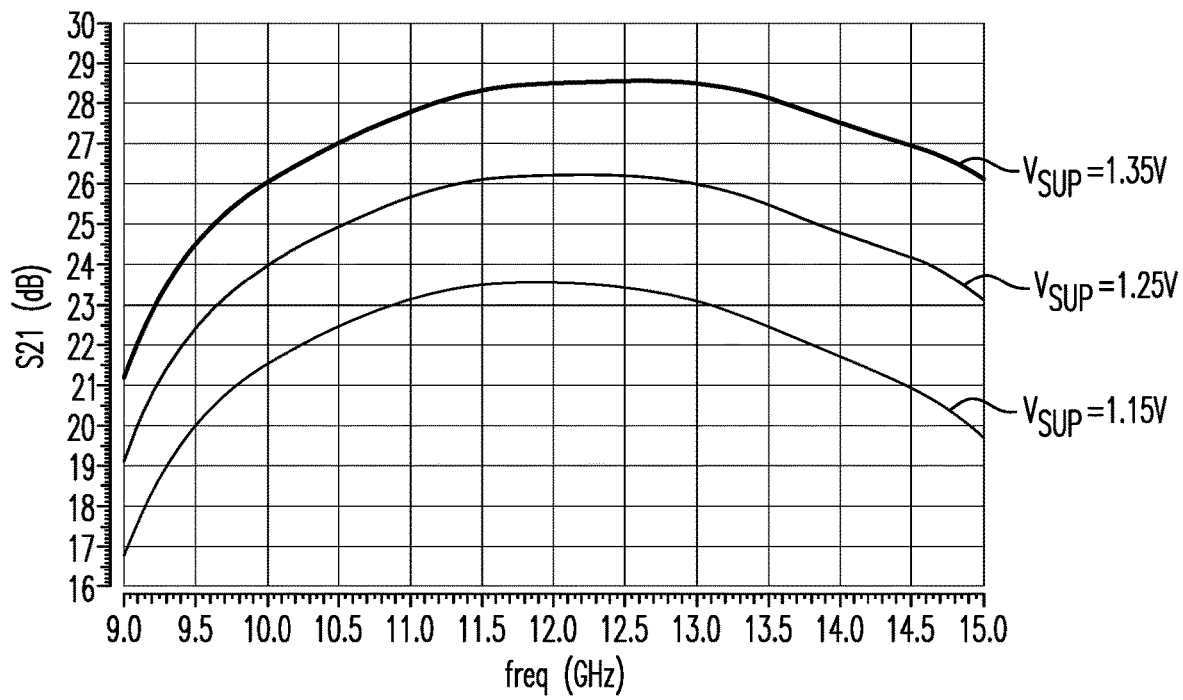
FIG. 5A is a graph of one example of plots of gain versus frequency for three different supply voltage levels.

FIG. 5A is a graph of one example of plots of gain versus frequency for three different supply voltage levels. The plots correspond to an example of a supply sensitive amplifier in which supply voltage compensation is not used. In the graph of FIG. 5A, plots of gain versus frequency are provided for supply voltage levels of 1.15V, 1.25V, and 1.35V.

As shown in FIG. 5A, large changes in gain (as indicated by a vertical offset of one plot to another) can occur as a result of supply voltage variation.

Figure 5B:
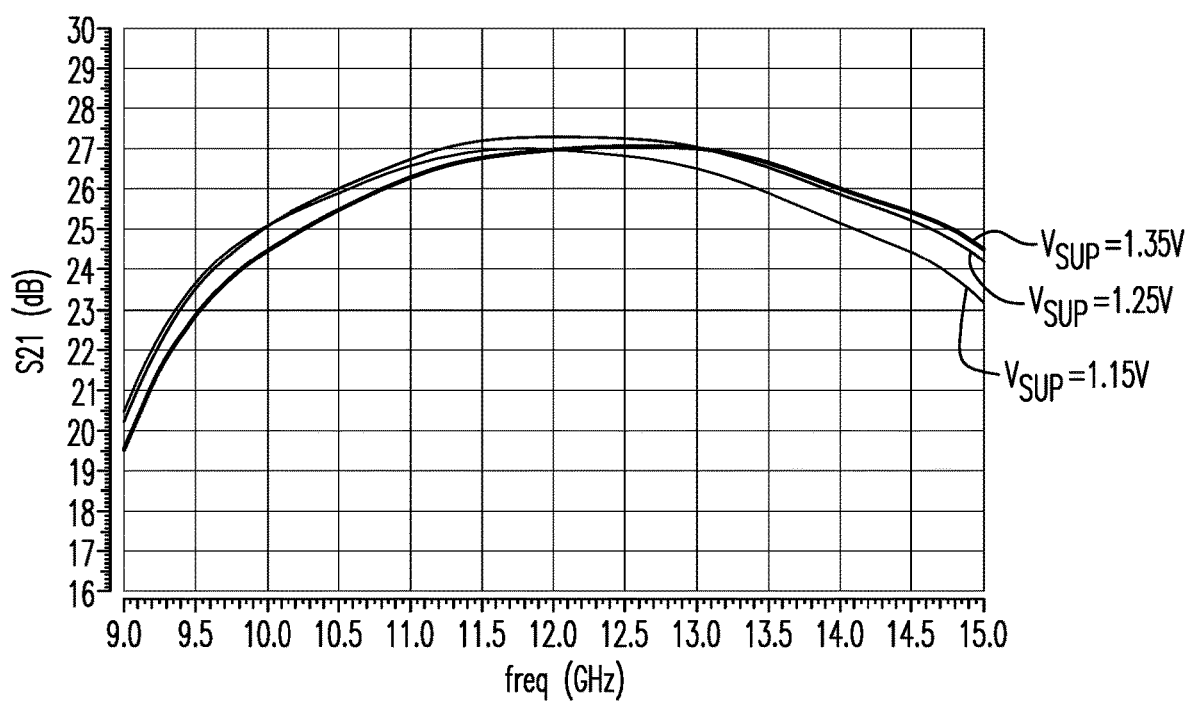
FIG. 5B is a graph of another example of plots of gain versus frequency for three different supply voltage levels.

FIG. 5B is a graph of another example of plots of gain versus frequency for three different supply voltage levels. The plots correspond to an example of one implementation of the supply sensitive amplifier 80 of FIG. 4B.

As shown by a comparison of FIG. 5A and FIG. 5B, providing supply voltage compensation reduces variation in amplifier gain.

Although one example of simulation results are depicted, other simulation results are possible. For example, simulation results can vary with circuit topology, simulation models, simulation parameters, and/or simulation tools. Accordingly, other results are possible.

Figure 6:
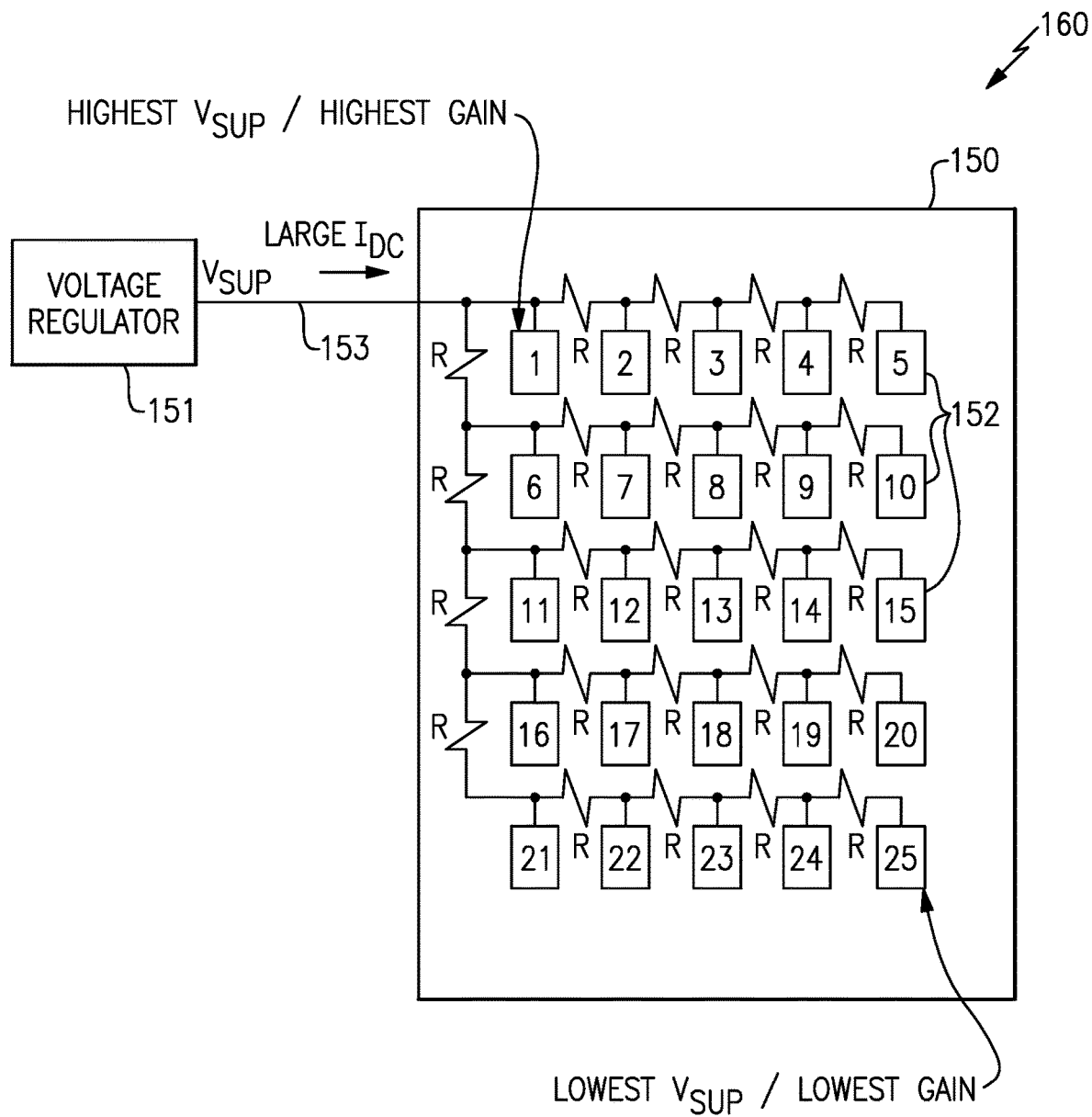
FIG. 6 is a schematic diagram of a multi-chip beamforming system according to one embodiment.

FIG. 6 is a schematic diagram of a multi-chip beamforming system 160 according to one embodiment. The multi-chip beamforming system 160 includes a circuit board 150, a voltage regulator 151, an array of beamforming ICs 152, and a supply conductor 153.

In the illustrated embodiment, the array of beamforming ICs 152 includes 25 totals ICs (indexed with indices 1 through 25) attached to the circuit board 152. However, other implementations are possible, such as IC arrays including more or fewer ICs. In certain implementations, each of the ICs 152 controls RF signals transmitted to and/or received from one or more corresponding antennas of an antenna array.

The voltage regulator 151 outputs a supply voltage $V_{SUP}$ to the supply conductor 153. The voltage regulator 151 can be implemented in a wide variety of ways, such as using a switched-mode power supply or DC-to-DC converter. Although shown as being off of the circuit board 150, the voltage regulator 151 can alternatively be attached thereto.

When powering a large number of ICs using a common voltage regulator, a large DC current ($I_{DC}$) can flow from the voltage regulator 151. Since the supply conductor 153 has finite resistivity (as depicted in FIG. 6 by segments with resistance R, in this example), the flow of current can lead to I*R drop and variation in local supply voltage levels for the ICs in the array 152. For example, absent compensation, the upper-leftmost IC of the array 152 (with index 1) can have the highest supply voltage level and highest gain, while the bottom-rightmost IC of the array 152 (with index 25) can have the lowest supply voltage level and lowest gain.

By implementing the array of ICs 152 in accordance with the teachings herein, gain of the ICs in the array 152 is maintained substantially constant, and variation in supply voltage arising from I*R drop is compensated for.

Figure 7:
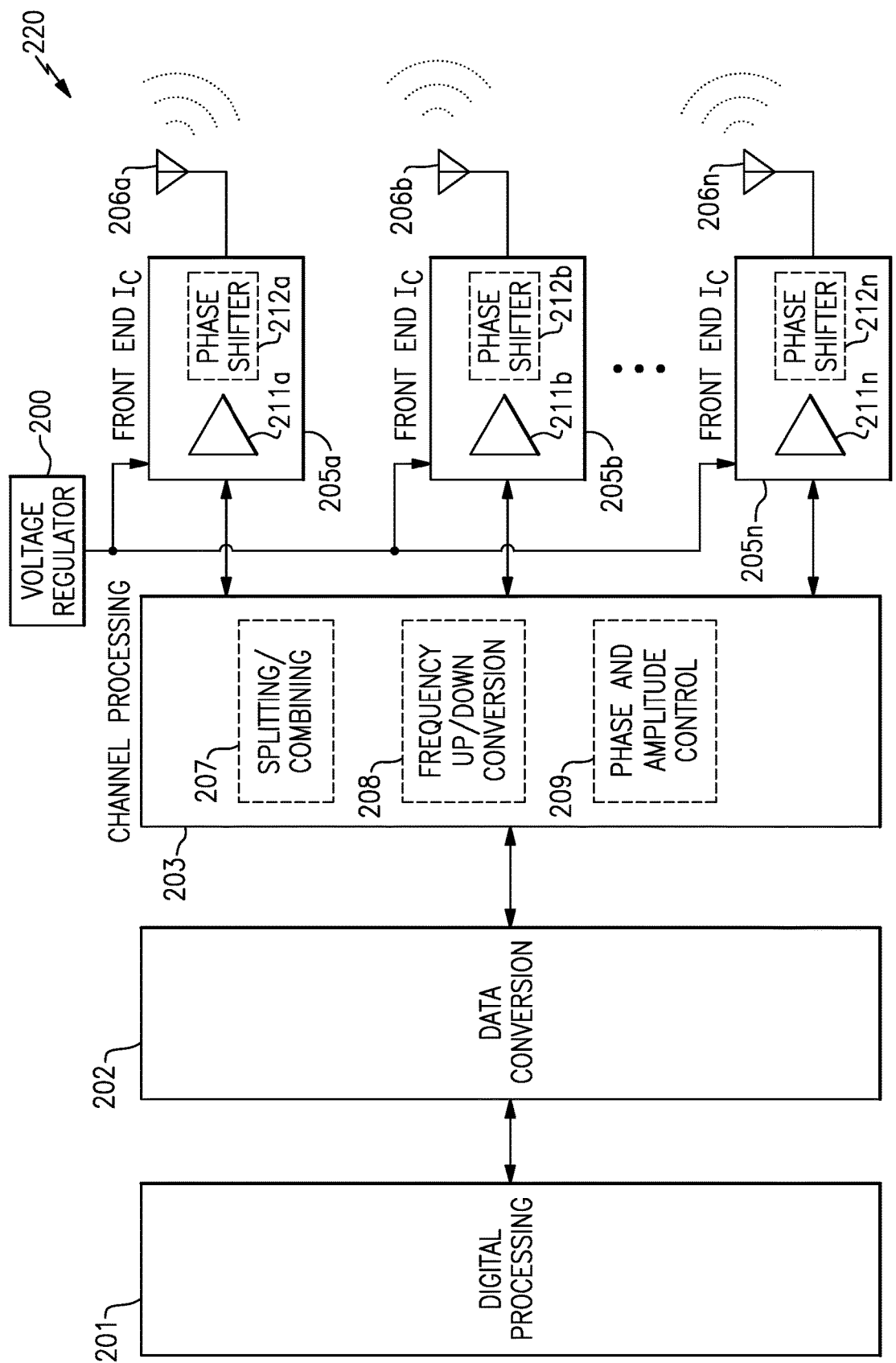
FIG. 7 is a schematic diagram of a phased array antenna system according to one embodiment.

FIG. 7 is a schematic diagram of a phased array antenna system 220 according to one embodiment. The phased array antenna system 220 includes a voltage regulator 200, a digital processing circuit 201, a data conversion circuit 202, a channel processing circuit 203, RF front end ICs 205a, 205b, . . . 205n, and antennas 206a, 206b, . . . 206n. Although an example with three RF front end ICs and three antennas is illustrated, the phased array antenna system 220 can include more or fewer RF front end ICs and/or more or fewer antennas as indicated by the ellipses. Furthermore, in certain implementations, the phased array antenna system 220 is implemented with separate antennas for transmitting and receiving signals.

The phased array antenna system 220 illustrates one embodiment of an electronic system that can include one or more ICs implemented in accordance with the teachings herein. However, the circuitry herein can be used in a wide range of electronics. A phased array antenna system is also referred to herein as an active scanned electronically steered array.

As shown in FIG. 7, the channel processing circuit 203 is coupled to antennas 206a, 206b, . . . 206n through RF front end ICs 205a, 205b, . . . 205n, respectively. The channel processing circuit 203 includes a splitting/combining circuit 207, a frequency up/down conversion circuit 208, and a phase and amplitude control circuit 209, in this embodiment. The channel processing circuit 203 provides RF signal processing of RF signals transmitted by and received from each communication channel. In the illustrated embodiment, each communication channel is associated with a corresponding RF front end IC and antenna.

With continuing reference to FIG. 7, the digital processing circuit 201 generates digital transmit data for controlling a transmit beam radiated from the antennas 206a, 206b, . . . 206n. The digital processing circuit 201 also processes digital receive data representing a receive beam. In certain implementations, the digital processing circuit 201 includes one or more baseband processors.

As shown in FIG. 7, the digital processing circuit 201 is coupled to the data conversion circuit 202, which includes digital-to-analog converter (DAC) circuitry for converting digital transmit data to one or more baseband transmit signals and analog-to-digital converter (ADC) circuitry for converting one or more baseband receive signals to digital receive data.

The frequency up/down conversion circuit 208 provides frequency upshifting from baseband to RF and frequency downshifting from RF to baseband, in this embodiment. However, other implementations are possible, such as configurations in which the phased array antenna system 220 operates in part at an intermediate frequency (IF). In certain implementations, the splitting/combining circuit 207 provides splitting to one or more frequency upshifted transmit signals to generate RF signals suitable for processing by the RF front end ICs 205a, 205b, . . . 205n and subsequent transmission on the antennas 206a, 206b, . . . 206n. Additionally, the splitting/combining circuit 207 combines RF signals received vias the antennas 206a, 206b, . . . 206n and RF front end ICs 205a, 205b, . . . 205n to generate one or more baseband receive signals for the data conversion circuit 202.

The channel processing circuit 203 also includes the phase and amplitude control circuit 209 for controlling beamforming operations. For example, the phase and amplitude control circuit 209 controls the amplitudes and phases of RF signals transmitted or received via the antennas 206a, 206b, . . . 206n to provide beamforming. With respect to signal transmission, the RF signal waves radiated from the antennas 206a, 206b, . . . 206n aggregate through constructive and destructive interference to collectively generate a transmit beam having a particular direction. With respect to signal reception, the channel processing circuit 203 generates a receive beam by combining the RF signals received from the antennas 206a, 206b, . . . 206n after amplitude scaling and phase shifting.

Phased array antenna systems are used in a wide variety of applications including, but not limited to, mobile communications, military and defense systems, and/or radar technology.

As shown in FIG. 7, the RF front ends 205a, 205b, . . . 205n each include one or more controllable gain amplifiers 211a, 211b, . . . 211n, which are used to scale the amplitude of RF signals transmitted or received by the antennas 206a, 206b, . . . 206n, respectively. Additionally, the RF front end ICs 205a, 205b, . . . 205n each include one or more controllable phase shifters 212a, 212b, . . . 212n for phase-shifting the RF signals. For example, in certain implementations the phase and amplitude control circuit 209 generates gain control signals for controlling the amount of gain provided by the controllable amplifiers 211a, 211b, . . . 211n and phase control signals for controlling the amount of phase shifting provided by the phase shifters 212a, 212b, . . . 212n.

The phased array antenna system 220 operates to generate a transmit beam or receive beam including a main lobe pointed in a desired direction of communication. The phased array antenna system 220 realizes increased signal to noise (SNR) ratio in the direction of the main lobe. The transmit or receive beam also includes one or more side lobes, which point in different directions than the main lobe and are undesirable.

An accuracy of beam direction of the phased array antenna system 220 is based on a precision in controlling the phases of the RF signals communicated via the antennas 206a, 206b, . . . 206n. For example, when one or more of the RF signals has a large phase error, the beam can be broken and/or pointed in an incorrect direction. Furthermore, the size or magnitude of beam side lobe levels is based on an accuracy in controlling the amplitude of the RF signals.

Accordingly, it is desirable to tightly control the phase and amplitude of RF signals communicated by the antennas 206a, 206b, . . . 206n to provide robust beamforming operations.

As shown in FIG. 7, the voltage regulator 200 provides a supply voltage to the front end ICs 205a, 205b, . . . 205n. By implementing the front end ICs 205a, 205b, . . . 205n in accordance with the teachings herein, beamforming operations of the phased array antenna system 220 are enhanced by providing insensitivity to power supply variation.

Applications

Devices employing the above described schemes can be implemented into various electronic devices. Examples of electronic devices include, but are not limited to, RF communication systems, consumer electronic products, electronic test equipment, communication infrastructure, etc. For instance, the circuitry herein can be included in a wide range of RF communication systems, including, but not limited to, radar systems, base stations, mobile devices (for instance, smartphones or handsets), phased array antenna systems, laptop computers, tablets, and/or wearable electronics.

The teachings herein are applicable to RF communication systems operating over a wide range of frequencies, including not only RF signals between 100 MHz and 7 GHz, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave communication systems.

The signals amplified by the signal processing circuits herein can be associated with a variety of communication standards, including, but not limited to, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

Conclusion

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A semiconductor die for a multi-chip signal processing system, the semiconductor die comprising:
   a supply pin configured to receive a supply voltage;
   a supply sensing circuit configured to sense a local voltage level of the supply voltage and generate a sense signal based on the local voltage level of the supply voltage at the supply pin;
   a bias control circuit configured to adjust a bias signal based on the sense signal to account for a difference between a nominal voltage level of the supply voltage and the local voltage level of the supply voltage and compensate for supply voltage variations in the multi-chip signal processing system; and
   a signal processing circuit biased by the bias signal, wherein the signal processing circuit includes a radio frequency (RF) amplifier having a DC operating point set by the bias signal, the RF amplifier configured to amplify an RF signal based at least in part on the bias signal.

2. The semiconductor chip of claim 1, wherein the bias control circuit is configured to adjust the bias signal to maintain a gain of the RF amplifier substantially constant.

3. The semiconductor chip of claim 1, wherein the bias control circuit includes a bias current source configured to output a bias current, wherein the supply sensing circuit is configured to generate a sense current operable to adjust the bias current.

4. The semiconductor chip of claim 1, wherein an output of the signal processing circuit is combined with an output of one or more additional signal processing circuits to generate a combined signal.

5. The semiconductor chip of claim 4, wherein the combined signal is a signal beam.

6. The semiconductor chip of claim 1, further comprising a voltage regulator configured to generate the supply voltage.

7. The semiconductor chip of claim 1, wherein the supply sensing circuit includes a voltage to current loop configured to convert a detected voltage difference between the local voltage level and a ground voltage to a sense current, and to adjust the bias signal based on the sense current.

8. An electronic system comprising:
a supply conductor configured to route a supply voltage having a nominal voltage level; and
a plurality of semiconductor dies, wherein each of the plurality of semiconductor dies comprises:
a supply pin configured to receive the supply voltage from the supply conductor;
a supply sensing circuit configured to sense a local voltage level of the supply voltage and generate a sense signal based on the local voltage level of the supply voltage at the supply pin;
a bias control circuit configured to adjust a bias signal based on the sense signal to account for a difference between the nominal voltage level of the supply voltage and the local voltage level of the supply voltage and compensate for supply voltage variations in the electronic system; and
a signal processing circuit biased by the bias signal, wherein the signal processing circuit includes a radio frequency (RF) amplifier having a DC operating point set by the bias signal, the RF amplifier configured to amplify an RF signal based at least in part on the bias signal.

9. The electronic system of claim 8, wherein the bias control circuit is configured to adjust the bias signal to maintain a gain of the RF amplifier substantially constant.

10. The electronic system of claim 8, wherein the bias control circuit includes a bias current source configured to output a bias current, wherein the supply sensing circuit is configured to generate a sense current operable to adjust the bias current.

11. The electronic system of claim 8, wherein the supply sensing circuit includes a voltage to current loop configured to convert a detected voltage difference between the local voltage level and a ground voltage to a sense current, and to adjust the bias signal based on the sense current.

12. A method of compensating for supply voltage variation in an electronic system, the method comprising:
providing a supply voltage to a plurality of semiconductor dies using a supply conductor, the supply voltage having a nominal voltage level;
receiving the supply voltage at a supply pin of each of the plurality of semiconductor dies;
sensing a local voltage level of the supply voltage of each of the plurality of semiconductor dies;
generating a sense signal based on the local voltage level of the supply voltage at the supply pin of each of the plurality of semiconductor dies;
adjusting a bias signal on each of the plurality of semiconductor dies based on the sense signal to account for a difference between the nominal voltage level of the supply voltage and the local voltage level of the supply voltage and compensate for supply voltage variations in the electronic system; and
biasing a signal processing circuit on each of the plurality of semiconductor dies using the bias signal, wherein biasing the signal processing circuit includes setting a DC operating point of a radio frequency (RF) amplifier using the bias signal, the RF amplifier configured to amplify an RF signal based at least in part on the bias signal.

13. The method of claim 12, further comprising adjusting the bias signal to maintain a gain of the amplifier substantially constant.

14. The method of claim 12, wherein adjusting the bias signal includes generating a sense current based on a voltage difference between the local voltage level of the supply voltage and a ground voltage, and adjusting a bias current of the amplifier using the sense current.

15. The method of claim 12, further comprising combining an output signal from each signal processing circuit of the plurality of semiconductor dies to generate a combined signal.

16. The method of claim 15, wherein the combined signal is a signal beam.

17. The method of claim 12, further comprising generating the supply voltage using a voltage regulator.

18. The method of claim 12, wherein setting the DC operating point of the RF amplifier using the bias signal includes controlling a current of a controllable bias current source based on the local voltage level of the supply voltage, mirroring the current of the controllable bias current source to generate a mirrored current, and providing the mirrored current through a plurality of bias field-effect transistors (FETs) to set the DC operating point of the RF amplifier.

19. The method of claim 18, wherein the RF amplifier is a cascode amplifier including a common source FET and a cascode FET in series, the DC operating point set at a gate of the common source FET that is connected to a gate of a first bias FET of the plurality of bias FETs.

20. The method of claim 19, further comprising biasing a gate of the cascode FET and a gate of a second bias FET of the plurality of bias FETs using a cascode bias voltage.

* * * * *